US009287831B2

(12) United States Patent
Lukashevich (10) Patent No.: US 9,287,831 B2
(45) Date of Patent: Mar. 15, 2016

(54) TEMPERATURE STABILIZED CIRCUITRY

(71) Applicant: ANALOG DEVICES GLOBAL, Hamilton (BM)

(72) Inventor: Dzianis Lukashevich, Munich (DE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/139,672

(22) Filed: Dec. 23, 2013

(65) Prior Publication Data
US 2015/0180425 A1  Jun. 25, 2015

(51) Int. Cl.
*H03F 1/30* (2006.01)
*H01L 27/12* (2006.01)

(52) U.S. Cl.
CPC .............. *H03F 1/30* (2013.01); *H01L 27/1203* (2013.01); *H03F 2200/447* (2013.01); *H03F 2200/468* (2013.01); *H03F 2200/528* (2013.01)

(58) Field of Classification Search
CPC ......... H03L 22/30; H03L 22/32; H03L 22/34; H03F 1/30; H03F 2200/528; H03F 2200/447; G01R 31/2891; G01R 31/2851; G01R 31/2856
USPC ............ 257/48, 467, 469, 347; 219/494, 497, 219/483
See application file for complete search history.

(56) References Cited

U.S. PATENT DOCUMENTS

| 3,383,614 | A |   | 5/1968 | Emmons et al. |
| 4,786,970 | A |   | 11/1988 | Moore |
| 4,990,803 | A |   | 2/1991 | Gilbert |
| 5,010,410 | A |   | 4/1991 | Bernstein |
| 5,309,090 | A | * | 5/1994 | Lipp ........................ 324/750.03 |
| 5,600,174 | A | * | 2/1997 | Reay et al. ..................... 257/467 |
| 5,783,854 | A | * | 7/1998 | Dries .................. H01L 27/0211 257/467 |
| 5,805,011 | A |   | 9/1998 | Comino |
| 6,111,280 | A | * | 8/2000 | Gardner et al. ............... 257/253 |
| 6,329,690 | B1 |   | 12/2001 | Morrett et al. |
| 6,861,860 | B2 | * | 3/2005 | Maggi et al. ............. 324/750.05 |
| 7,261,461 | B2 | * | 8/2007 | Grudin et al. ..................... 374/43 |
| 7,830,134 | B2 | * | 11/2010 | Hawkins et al. ............... 324/130 |
| 8,030,952 | B2 | * | 10/2011 | Kinsley .............. G01R 31/2851 324/750.03 |
| 8,508,370 | B1 | * | 8/2013 | El-Kady et al. ............ 340/572.1 |
| 8,669,823 | B1 | * | 3/2014 | Olsson et al. .................. 331/154 |
| 8,758,688 | B2 | * | 6/2014 | De Keersmaecker et al. ......................... 422/82.01 |
| 2002/0014639 | A1 |   | 2/2002 | Imai et al. |
| 2008/0032467 | A1 |   | 2/2008 | Vashchenko et al. |
| 2008/0069971 | A1 | * | 3/2008 | Keersmaecker et al. ..... 427/555 |
| 2008/0084199 | A1 | * | 4/2008 | Hawkins et al. ................ 324/74 |
| 2014/0217613 | A1 | * | 8/2014 | Udrea-Spenea et al. ................. H01L 23/49575 257/777 |

OTHER PUBLICATIONS

Parthasarathy et al., "A 0.25μm CMOS based 70V smart power technology with deep trench for high-voltage isolation," International Electron Devices Meeting, pp. 459-462, 2002.
Analog Devices, "AD8307: Low Cost, DS to 500 MHz, 92 dB Logarithmic Amplifier," Data Sheet for AD8307, Rev. D, Jul. 2008, 24 pages. Available at: http://www.analog.com/static/importedfiles/data_sheets/AD8307.pdf (accessed Mar. 11, 2014).

(Continued)

*Primary Examiner* — Nikolay Yushin
(74) *Attorney, Agent, or Firm* — Knobbe, Martens, Olson & Bear LLP (57) ABSTRACT

This disclosure relates to temperature stabilization of at least a portion of an amplifier, such as a logarithmic amplifier, and/or a band gap reference circuit. In one aspect, one or more stages of an amplifier, a heater, and a temperature sensor are included in a semiconductor material and surrounded by thermally insulating sidewalls.

24 Claims, 6 Drawing Sheets

(56) References Cited

OTHER PUBLICATIONS

Analog Devices, MT-077 Tutorial, Log Amp Basics, Rev.0, pp. 1-6, Oct. 2008. Available at: http://www.analog.com/static/imported-files/tutorials/MT-077.pdf (accessed Mar. 11, 2014).

Gray et al., "Analysis and Design of Temperature Stabilized Substrate Integrated Circuits." IEEE Journal of Solid-State Circuits, vol. SC-9, No. 2, pp. 61-69, Apr. 1974.

Extended European Search Report issued for European Application No. 14193854.8, Jul. 6, 2015, 6 pages.

\* cited by examiner

TEMPERATURE STABILIZED CIRCUITRY

TECHNICAL FIELD

The disclosed technology relates to electronics, and, more particularly, to heating circuit elements for on-chip temperature stabilization.

DESCRIPTION OF THE RELATED TECHNOLOGY

Temperature stabilization of circuit elements is typically desirable. Circuit elements, including active circuit elements and passive circuit elements, can experience variations in performance due to temperature. In one example, an amplifier can have a gain that varies based on an operating and/or ambient temperature of the amplifier. The temperature of such an amplifier can be stabilized by sensing a temperature associated with the amplifier and heating the amplifier based on the sensed temperature.

Previous methods of temperature stabilization included using relatively complex stabilization circuitry and/or external heaters to heat integrated circuits. Moreover, previous methods of temperature stabilization have been relatively expensive to implement.

A need exists for improved temperature stabilization of circuit elements.

SUMMARY OF CERTAIN INVENTIVE ASPECTS

One aspect of this disclosure is an integrated circuit that includes temperature stabilized circuitry, a temperature sensor, a heater, and other circuit elements. The temperature sensor is configured to gather an indication of temperature associated with the temperature stabilized circuitry. The heater is configured to heat the temperature stabilized circuitry based on the indication of temperature. The other circuit elements are thermally isolated from the temperature sensor, the heater, and the circuitry. In certain embodiments, the temperature stabilized circuit comprises at least one of a band gap reference circuit or at least a portion of an amplifier.

Another aspect of this disclosure is an apparatus that includes at least a portion of an amplifier in a semiconductor material, a temperature sensor, a heater, and at least one thermally insulating sidewall. The temperature sensor is configured to gather an indication of temperature in the semiconductor material. The heater is in the semiconductor material and configured to heat the portion of the amplifier based on the indication of temperature. The thermally insulating sidewall is configured to thermally isolate the portion of the amplifier, the temperature sensor, and the heater on one side of the thermally insulating sidewall from other circuit elements on an opposing side of the thermally insulating sidewall. The portion of the amplifier and the circuit elements are included on the same integrated circuit die.

Another aspect of this disclosure is an integrated circuit that includes an amplifier comprising at least a first stage and a second stage; a first temperature sensor associated with the first stage of the amplifier; a first heater configured to heat the first stage of the amplifier based on feedback from the first temperature sensor; a second temperature sensor associated with the second stage of the amplifier; and a second heater configured to heat the second stage of the amplifier based on feedback from the second temperature sensor.

Another aspect of this disclosure is method of heating at least a portion of an amplifier. The method can include sensing a temperature associated with at least a portion of an amplifier, wherein the portion of the amplifier is in a semiconductor-on-insulator (SOI) material over an insulating layer and surrounded by insulating sidewalls; and heating the portion of the amplifier with a heater responsive to said sensing to maintain the portion of the amplifier at a selected temperature, wherein the heater is in the same SOI material, and wherein the selected temperature is higher than an ambient temperature.

Yet another aspect of this disclosure is an apparatus that includes a band gap reference circuit, a temperature sensor, a heater, and thermally insulating sidewalls. The temperature sensor is configured to gather an indication of temperature associated with the band gap reference circuit. The heater is configured to heat at least a portion of the band gap reference circuit based on the indication of temperature. The thermally insulating sidewalls surround the band gap reference circuit, the temperature sensor, and the heater. The thermally insulating sidewalls are configured to thermally isolate the band gap reference circuit from other circuit elements outside of the thermally insulating sidewalls. The band gap reference circuit and the other circuit elements are included on the same integrated circuit die.

An amplifier can also be included in this apparatus in certain implementations. At least a portion of the amplifier can be surrounded by the thermally insulating sidewalls according to some of these implementations. In some other implementations, at least a portion of the amplifier is surrounded by second thermally insulating sidewalls. In some instances, thermally insulating sidewalls can be nested to provide additional thermal insulation. For example, second thermally insulating sidewalls can surround first thermally insulating sidewalls. According to various implementations, the apparatus can include an insulating material, wherein the band gap reference circuit is over the insulating material, and wherein the thermally insulating sidewalls extend to the insulating material.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale.

As discussed above, in a variety of applications, temperature stabilization of circuit elements is typically desirable. For example, in instrumentation, heath care, military, and industrial applications, there is a need for temperature stabilized amplifiers. Temperature stabilization can be implemented in high quality, high precision devices. As one example, temperature stabilization of logarithmic amplifiers (Log Amps) can be particularly desirable due to a need for precision that is substantially independent of ambient temperature for applications of Log Amps. A heater can adjust how much heat is applied to some or all of the Log Amp based on data gathered by temperature sensors. This can maintain at least a portion of the Log Amp at a substantially constant temperature as ambient temperature changes. Temperature stabilized Log Amps can maintain a logarithmic slope, an intercept, other characteristics of the Log Amp, or any combination thereof at values that are substantially independent of the ambient temperature. In other examples, temperature stabilization can be applied to other types of amplifiers, such as differential amplifiers, operational amplifiers, power amplifiers, or low-noise amplifiers (LNAs), among others.

According to embodiments described herein, a heater can heat some or all of at least one amplifier stage to a selected temperature. Such an amplifier stage with the heater can be included in a Log Amp, for example. The heater can include one or more transistors and/or one or more diodes and/or other power dissipating devices as heating elements configured to heat the amplifier stage to the selected temperature responsive to an indication of temperature gathered by one or more temperature sensors. The heater can be embedded into a semiconductor material of an integrated circuit, such as silicon. The semiconductor material can be a semiconductor-on-insulator (SOT) material. Thermally insulating sidewalls or trenches can surround the heater and the amplifier stage. Accordingly, the heating elements, temperature sensors and the amplifier stage can be thermally isolated from other circuit elements on the same integrated circuit, such as a power management block, and/or other circuit elements on another integrated circuit.

The thermally insulating sidewalls can extend from an upper surface of the semiconductor material or substrate down sufficiently deep to thermally isolate devices at the upper surface on either side of the insulating sidewalls from one another. For example, in an SOI substrate, the thermally insulating sidewalls can extend down to the buried insulator layer; in other (e.g., non-SOI) embodiments, the thermally insulating sidewalls do not contact a lower insulator, but rather extend significantly more deeply into the substrate than shallow trenches for electrical isolation between devices. Silicon dioxide is an example of an as electrical isolator. The thermal conductivity of silicon dioxide is significantly lower compared to the thermal conductivity of a silicon-based substrate. Accordingly, silicon dioxide and/or other electrical isolators can also provide thermal isolation in silicon-based substrates. Although thermally insulating sidewalls can extend through all of the semiconductor material or substrate, some heat may transfer through the thermally insulating sidewalls, which can comprise silicon dioxide. In certain embodiments, the thermally insulating sidewalls can surround the entire amplifier. According to some other embodiments, different amplifier stages of the same amplifier can be thermally isolated from each other on the same integrated circuit or semiconductor substrate. In some of these embodiments, the different amplifier stages can be heated to different temperatures. For instance, an input stage of an amplifier can be heated to a higher temperature than a subsequent amplifier stage of the same amplifier. This can apply more precise temperature stabilization for the first stage, which typically has a bigger impact on the overall performance than the last stage.

Heating some or all of an amplifier in accordance with the principles and advantages described herein can achieve one or more of the following advantages, among others. Amplifiers, such as Log Amps, can achieve a relatively high degree of temperature stabilization at a relatively low cost. Thermal isolation, for example using thermally insulating sidewalls, can keep heating localized and focused on one or more circuit elements for which temperature stabilization has a significant effect on performance. At the same time, circuits that are less sensitive to temperature (for example, biasing circuits) can remain substantially unheated by a heater. Accordingly, such focused heating can be efficient by keeping dissipation loss relatively low compared to heating both temperature sensitive and temperature insensitive circuit elements. In addition, any buried insulator layer and the thermally insulating sidewalls surrounding the semiconductor material can reduce or eliminate an impact that heating particular circuit elements has on the operation of other circuit elements outside of the thermally insulating sidewalls. The other circuit elements can be on the same integrated circuit die as the circuitry within the thermally insulating sidewalls. Heating different amplifier stages to different temperatures can result in lower total power dissipation compared to heating all amplifier stages to the same temperature. For instance, a higher temperature of the first stage relative to one or more later stages can reduce an amount of temperature dependent parameter variation (e.g. slope, intercept point, gain variation, etc.) and/or errors that get amplified in the one or more later stages. Additionally, the one or more later amplifier stages may be able to realize most benefits of temperature stabilization at a lower temperature than an earlier stage, such as an input stage. Additionally, later stages might have more power dissipation so that less heating is required.

Figure 1:
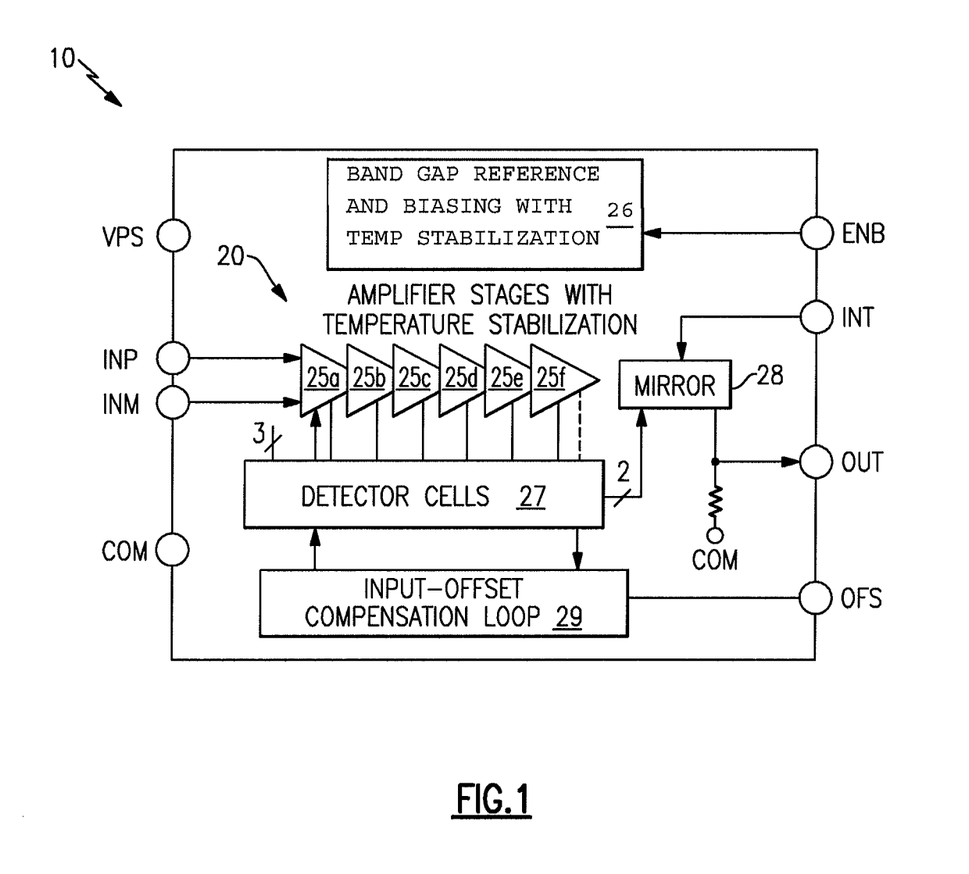
FIG. 1 is a schematic diagram of an integrated circuit that includes a logarithmic amplifier with temperature stabilization, according to an embodiment.

FIG. 1 is a schematic diagram of an illustrative integrated circuit 10 that includes a Log Amp with temperature stabilization, according to an embodiment. The integrated circuit 10 includes a Log Amp 20 that includes amplifier stages 25a-25f with temperature stabilization. The integrated circuit 10 also includes a biasing and band gap reference circuit 26 with temperature stabilization. Biasing for amplifier stages can be provided by two reference circuits: the first one can determine the gain of one or more of the amplifier stages and the second one can determine the logarithmic slope of the amplifier stage(s). The biasing and band gap reference circuit 26 can be stabilized against supply and temperature variations. While the temperature stabilized circuits of the illustrated integrated circuit 10 are represented by temperature stabilized amplifier stages and temperature stabilized band gap reference circuitry, the principles and advantages discussed herein can be applied to other temperature stabilized circuitry.

The integrated circuit 10 can be embedded be in a package. The integrated circuit can receive a positive supply voltage VPS and a common voltage COM, which is typically at a ground potential, applied to pins of the package. The Log Amp 20 can be a monolithic demodulating logarithmic amplifier based on successive detection technique implemented by detector cells 27. Successive detection can alternatively be referred to as progressive compression. An input-output compensation loop 29 can compensate for offsets responsive to an offset adjustment signal OFS. A band gap reference and biasing circuit 26 can enable or disable the integrated circuit responsive to an enable signal ENB. The Log Amp 20 can compress an input of a relatively wide dynamic range to its decibel equivalent. The Log Amp 20 can convert an input from one domain of representation to another via a precise nonlinear transformation. Accordingly, the Log Amp 20 can be used as a measurement device. In such measurements, it can be particularly advantageous that the measurements be substantially independent of ambient temperature. This can achieve a highest possible precision in certain implementations and/or applications.

A differential input signal $V_{IN}$ received at INP and INM pins can be compressed by the Log Amp 20. The output of a final amplifier stage 25f is provided to the output OUT of the integrated circuit via a current mirror 28. The current mirror 28 can adjust an output of the final amplifier stage 25f responsive to an intercept adjustment signal INT. The output OUT can have a logarithmic relationship with the differential input received at pins INP and INM. For instance, the output OUT can have a voltage $V_{OUT}$ that can be represented by the following equation:

$$V_{OUT} = V_Y \log\left(\frac{V_{IN}}{V_X}\right) \quad \text{(Equation 1)}$$

In Equation 1, $V_{OUT}$ represents the output voltage, $V_Y$ represents the slope voltage, $V_{IN}$ represents the input signal, and $V_X$ represents the intercept voltage when $V_{OUT}$ equals 0 V. When the logarithm is base 10, $V_Y$ can represent the slope in volts per decade. A Log Amp typically includes two scaling references to generate $V_X$ and $V_Y$ voltages. Those references determine the overall accuracy on the amplifiers. For instance, the absolute (thermal) accuracy of the Log Amp could not be better than the (thermal) accuracy of the scaling references. These $V_X$ and $V_Y$ voltages can be generated using one or more band gap reference circuits. The one or more band gap reference circuits can also be temperature stabilized. Both scaling voltages $V_X$ and $V_Y$, or the intercept point and the slope, respectively, can be temperature dependent.

Figure 2A:
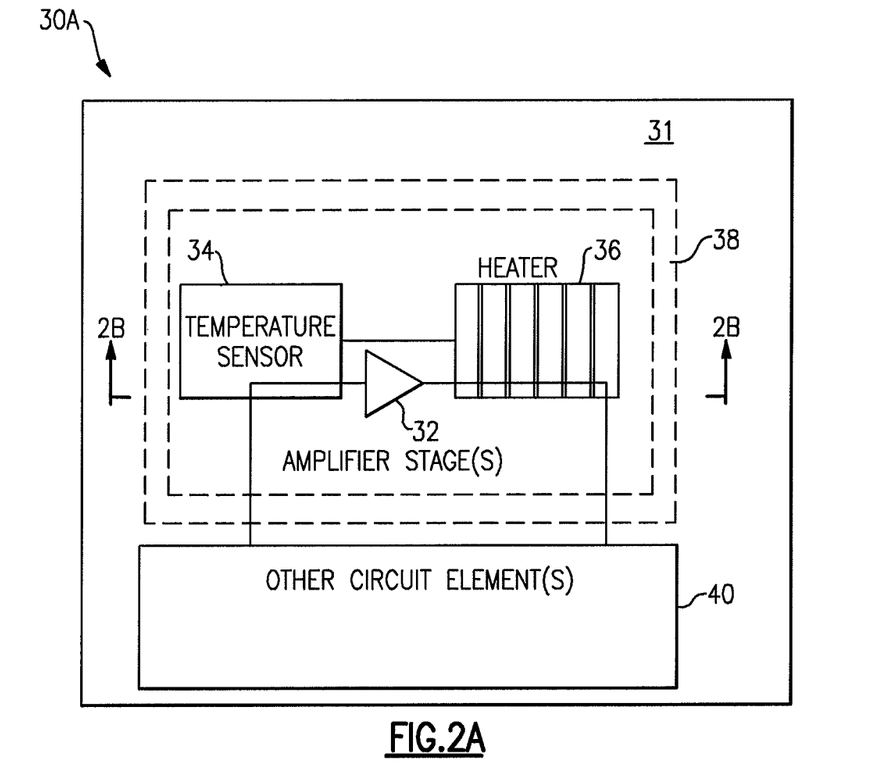
FIG. 2A is a block diagram of an integrated circuit that includes an amplifier stage in semiconductor-on-insulator (SOI) technology and an embedded heater with a temperature sensor surrounded by thermally insulating sidewalls, according to an embodiment.
Figure 2B:
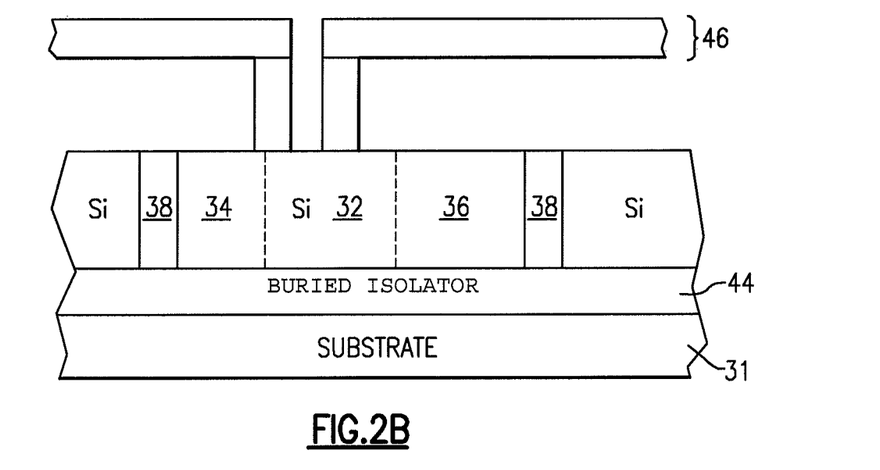
FIG. 2B is a schematic cross section of the integrated circuit of FIG. 2A along the line 2B-2B.

Referring to FIGS. 2A and 2B, a semiconductor-on-insulator (SOI) amplifier stage and an embedded heater surrounded by continuous thermally insulating sidewalls will be described. FIG. 2A is a block diagram of an integrated circuit 30A that includes an amplifier stage 32, one or more temperature sensor 34, and a heater comprising heating elements 36 surrounded by thermally insulating sidewalls or trenches 38. FIG. 2B is a cross section of the integrated circuit 30A along the line 2B-2B of FIG. 2A. As shown in FIG. 2B, the amplifier stage 32, the one or more temperature sensors 34, and the heating elements 36 are disposed over a buried insulating layer 44 on a substrate 31 in the illustrated embodiment. The principles and advantages discussed herein can be applied to partial amplifier stages and/or partial amplifier stages in combination with full amplifier stages. It will be understood that the integrated circuit 30A can include more or fewer elements than illustrated. In some embodiments, the integrated circuit 30A can include any combination of features of the integrated circuit 10 of FIG. 1.

In FIGS. 2A and 2B, the integrated circuit 30A includes a semiconductor-on-insulator (SOI) material continuously surrounded by thermally insulating sidewalls 38. The SOI material can comprise silicon, for example. The insulator which with the SOI material is disposed can comprise silicon oxide. The amplifier stage 32, the temperature sensors 34, and the heater elements 36 can be in the SOI material. While the block diagram of FIG. 2A and the schematic cross section of FIG. 2B illustrate heater elements 36 to one side of the amplifier stage 32, it will be understood that the heater 36 can include heating elements disposed around the amplifier stage 32. The heating elements can be disposed around the amplifier stage 32 in any suitable arraignment to provide a desired heating of the amplifier stage 32. For instance, the heating elements can be arranged to provide substantially uniform heating of the amplifier stage 32. The amplifier stage 32 can be electrically separate from the temperature sensor 34 and the heater 36. It will be understood that individual devices within the SOI material can be separated by conventional field isolation (not shown). In certain embodiments, the amplifier stage 32 can correspond to any one of the amplifier stages 25a-25f of the Log Amp 20 of FIG. 1. The temperature sensor 34 can be any suitable sensor configured to gather an indication of temperature in the SOI material. The heater 36 can be embedded in the SOI material. The heater 36 can comprise one or more transistors and/or one or more diodes and/or heat dissipating devices configured to generate heat.

The heater 36 can generate a variable amount of heat in response to an output of the temperature sensor 34 in order to maintain a substantially constant operating temperature $T_{OP}$. The operating temperature $T_{OP}$ can be represented by the following equation:

$$T_{OP} = T_A + \Delta T \quad \text{(Equation 2)}$$

In Equation 2, $T_A$ can represent an ambient temperature and $\Delta T$ can represent a change in temperature resulting from heat generated by the heater 36. The operating temperature $T_{OP}$ can be selected to be higher than a maximum ambient temperature $T_{A,MAX}$. Accordingly, the heater 36 can generate heat to raise the temperature above the ambient temperature $T_A$ to maintain a substantially constant operating temperature $T_{OP}$. It will be understood that this concept can be applied to a plurality of heaters.

Both the logarithmic intercept point $V_X$ and the slope $V_Y$ of a Log Amp are can be calibrated at the operating temperature $T_{OP}$ and be independent of the ambient temperature $T_A$. This can be due to having a substantially constant operating temperature $T_{OP}$. Operation at a substantially constant operating temperature $T_{OP}$ together with one or more internal compensation circuitries can provide a high level of precision in such a Log Amp.

The temperature sensor 34 can acquire an indication of the temperature of the SOI material. The indication of temperature can be representative of the operating temperature $T_{OP}$. The heater 36 can heat the amplifier stage 32 responsive to the indication of the temperature. As the ambient temperature $T_A$ decreases, the heater 36 can generate more heat to maintain the selected operating temperature $T_{OP}$. Similarly, as the ambient temperature $T_A$ increases, the heater 36 can generate less heat to maintain the selected operating temperature $T_{OP}$.

The heater 36 can receive a temperature control signal and set the operating temperature $T_{OP}$ at the selected temperature based on the temperature control signal. For instance, the temperature control signal can set the operating temperature $T_{OP}$ to a temperature selected in the range from 15° C. to 60° C. in one embodiment. The temperature control signal can be an analog signal or a digital signal depending on the implementation of the heater 36.

The thermally insulating sidewalls 38 can thermally isolate the amplifier stage 32 and the heater 36 from one or more other circuit elements 40 on the same integrated circuit 30A. As illustrated, the other circuit elements 40 and the amplifier stage 32 are on the same substrate 31. The other circuit elements 40 can include circuit elements that are less sensitive to changes in temperature than the amplifier stage 32. The other circuit elements 40 can include, for example, control and/or power management circuitry that are less sensitive to temperature than the amplifier stage 32. For instance, in one embodiment, the other circuit elements 40 can include at least a portion of the biasing circuit included in the band gap reference and biasing circuit 26 of FIG. 1. As another example, the other circuit elements 40 can include the current mirror 28 of FIG. 1. According to certain embodiments, the other circuit elements 40 can include other amplifier stages of the amplifier that includes the amplifier stage 32. As shown in FIG. 2A, the insulating sidewalls 38 can surround the amplifier stage 32, the temperature sensor 34, and the heater 36. In certain embodiments, an entire amplifier can be within the insulating sidewalls 38. The entire amplifier can be a single stage amplifier. Alternatively, the entire amplifier can include two or more stages.

As illustrated in FIG. 2A, the thermally insulating sidewalls 38 can be rectangular in plan view. In other embodiments (not illustrated), the thermally insulating sidewalls can be a different shape in plan view. For instance, the thermally insulating sidewalls can be annular. In one embodiment, only one or two walls can be used for thermal isolation purposes. According to some embodiments, thermally insulating sidewalls 38 can be surrounded by second thermally insulating sidewalls (not illustrated). Accordingly, thermally insulating sidewalls can be nested. Nested thermally insulating sidewalls can provide additional thermal isolation relative to one set of thermally insulating sidewalls. The thermally insulating sidewalls 38 can include thermally insulating material in trenches extending into a semiconductor material. The thermally insulating sidewalls 38 can include any suitable thermally insulating material. For example, the thermally insulating sidewalls 38 can include silicon oxide, silicon nitride, other dielectric materials, or the like.

As shown in FIG. 2B, the thermally insulating sidewalls 38 can separate semiconductor material into different regions. The thermally insulating sidewalls 38 can extend from an upper surface of the SOI material down to an insulating layer 44 on the substrate 31. The insulating layer 44 can be any suitable thermally insulating layer. For example, the insulating layer 44 can be a buried oxide, such as silicon dioxide. The thermally insulating sidewalls 38 and the insulating layer 44 can together form a thermally insulated region. The amplifier stage 32 can be electrically connected to another isolated amplifier stage and/or other circuit elements 40 outside of the thermally insulated region by way of metal layers.

One or more conductive lines 46 above the SOI material can electrically connect the amplifier stage 32 to one or more circuit elements outside of the thermally insulated region. For instance, one conductive line 46 can be electrically connected to an input of the amplifier stage 32 and another conductive line 46 can be electrically connected to an output of the amplifier stage 32. As illustrated, the SOI material can be disposed between the insulating layer 44 and at least a portion of one conductive line 46. The conductive lines 46 can include any suitable conductive material, such as aluminum, copper, polysilicon, tungsten, or the like.

Figure 2C:
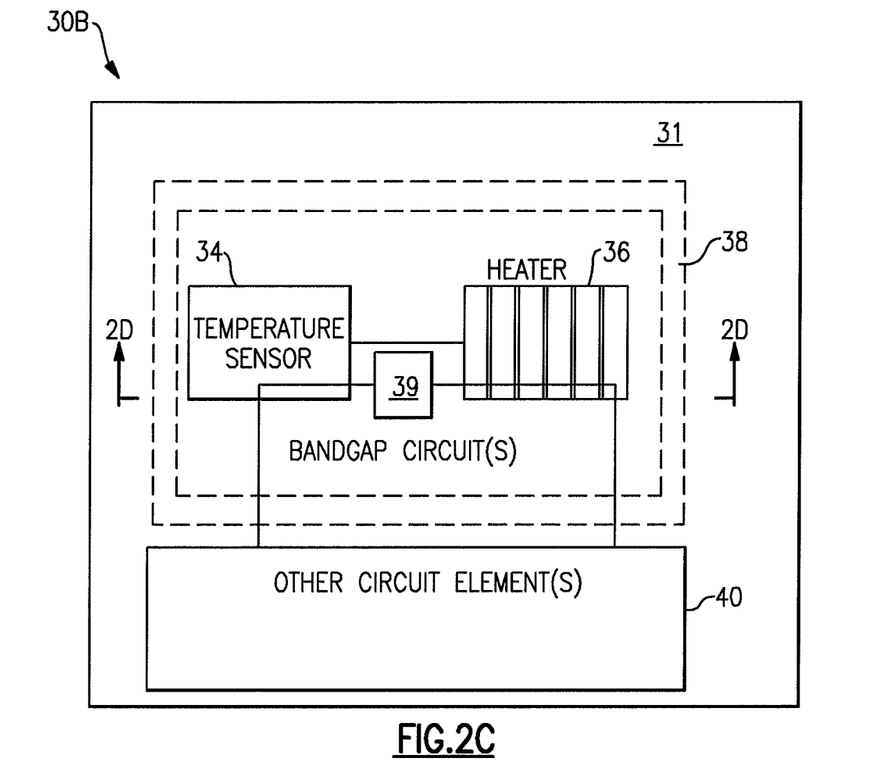
FIG. 2C is a block diagram of an integrated circuit that includes a band gap reference circuit in semiconductor-on-insulator (SOI) technology and an embedded heater with a temperature sensor surrounded by thermally insulating sidewalls, according to an embodiment.
Figure 2D:
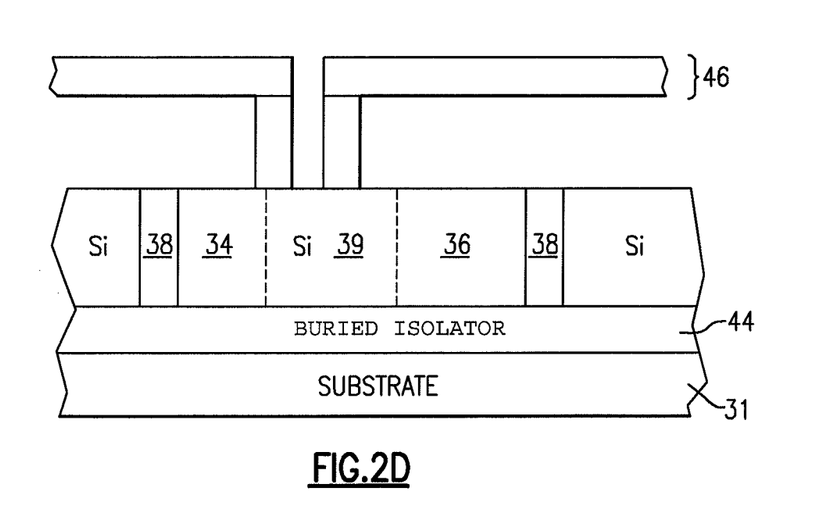
FIG. 2D is a schematic cross section of the integrated circuit of FIG. 2C along the line 2D-2D.

FIGS. 2C and 2D illustrate an embodiment of an integrated circuit 30B that includes one or more band gap reference circuits 39 in a thermally insulated region. In some applications, temperature stabilization of a band gap reference circuit 39 can have a more significant influence on system performance than temperature stabilization of one or more amplifier stages. Any of the principles and advantages discussed with reference to FIG. 2A and/or FIG. 2B can be applied to the integrated circuit 30B of FIGS. 2C and 2D. In one embodiment, one or more band gap reference circuits 39 include a first band gap reference circuit associated with the slope voltage $V_Y$ of a Log Amp and a second band gap reference circuit associated with the intercept voltage $V_X$ of the Log Amp. In another embodiment, these two band gap reference circuits can be included in two different thermally insulated regions that are separated by thermally insulating sidewalls.

Figure 3:
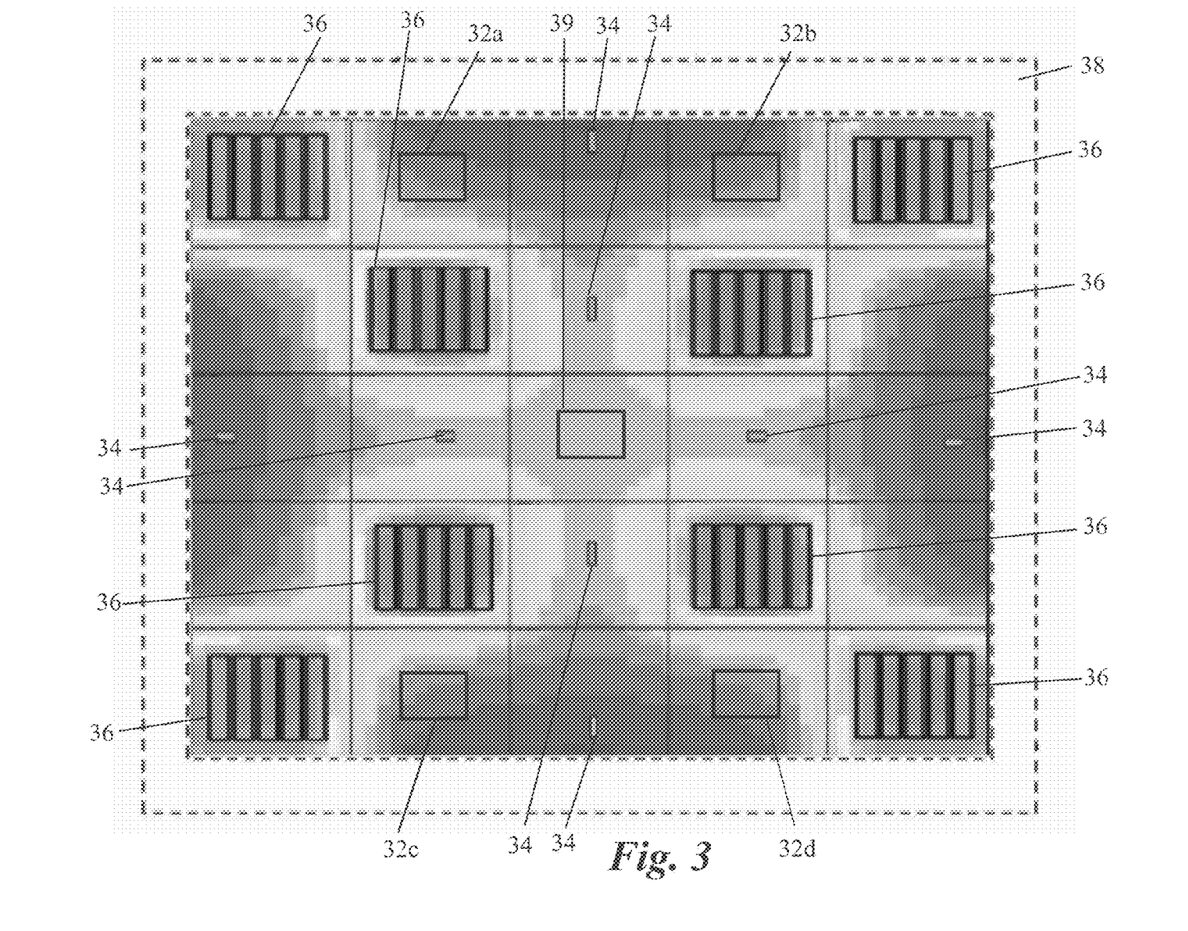
FIG. 3 is a block diagram of temperature sensors and heating elements within thermally insulating sidewalls, according to an embodiment.

FIG. 3 is a block diagram of temperature sensors 34 and heaters 36 within a region surrounded by thermally insulating sidewalls 38, according to an embodiment. FIG. 3 illustrates that multiple heaters 36 and multiple temperature sensors 34 can be within a single thermally insulated region surrounded by thermally insulating sidewalls 38. Two or more temperature sensors 34 can be in feedback communication with a single heater 36. The two or more temperature sensors 34 can be in direct feedback communication with a single heater 36. Alternatively, the two or more temperature sensors 34 can be in feedback communication with a single heater 36 via a control block and/or other circuit element(s). Two or more heaters 36 can receive an indication of temperature from a single temperature sensor 34. In some implementations, one or more intervening circuit elements can be electrically coupled between a temperature sensor 34 and a heater 36. The one or more intervening circuit elements can be within the region surrounded by thermally insulating sidewalls 38. Alternatively, the one or more intervening circuit elements can be outside of the region surrounded by the thermally insulating sidewalls 38.

The multiple heaters 36 can heat some stages or all of an amplifier. One or more amplifier stages, such as one or more of the amplifier stages 25a-25f of FIG. 1, the amplifier stage 32 of FIG. 2A, or the like can be disposed within the insulating sidewalls 38 and between the temperature sensors 34 and the heaters 36 of FIG. 3. The thermally insulating sidewalls illustrated in FIG. 3 can surround an entire amplifier according to some embodiments. The entire amplifier can be surrounded by two or more sets of thermally insulating sidewalls 38 to achieve better thermal isolation in certain embodiments.

FIG. 3 also shows a distribution of heat generated by the heaters 36 within the region surrounded by the thermally insulating sidewalls 38. In FIG. 3, a heat distribution is reflected by the shading within the thermally insulating sidewalls 38. Lighter shading indicates more heat being generated by the heaters 36 in particular areas and darker shading indicates less heating from the heaters 36 in particular areas. The heaters 36 can comprise relatively large transistors embedded into silicon. FIG. 3 also illustrates that the heat distribution resulting from one or more heaters 36 within a thermally insulated region need not be uniform. Accordingly, heater(s) 36 can provide different amounts of heat to different areas within a thermally insulated region. In some instances, this can result in the different areas being heated to different temperatures.

FIG. 3 illustrates that amplifier stages 32a to 32d can be disposed between sensor(s) 34 and/or heater(s) 36 within the thermally insulating sidewalls 38. While four amplifier stages 32a to 34d are shown for illustrative purposes, it will be understood that any suitable number of amplifier stages can be included within the insulating sidewalls.

A band gap reference circuit 39 is included within the insulating sidewalls 38 of FIG. 3. The thermally insulating sidewalls 38 can surround one or more band gap reference circuits 39 and one or more amplifier stages 32. Accordingly, one or more band gap reference circuits 39 and one or more amplifier stages 32 can be disposed in a single thermally insulated region. In other embodiments, a band gap reference circuit and an amplifier stage can be in different thermally insulated regions.

A circuit for which a highest level of heating is desired can be arranged at or near the center of a thermally insulated region. For instance, if the highest amount of heating were desired for a band gap reference circuit 39, the band gap reference circuit 39 can be disposed at or near the center of a thermally insulated region, for example, as shown in FIG. 3. Other circuits can be disposed at or near the center of the thermally insulated region in other embodiments.

Several amplifiers include multiple stages. Temperature stabilization of a multi-stage amplifier may involve heating different stages of the amplifier to different operating temperatures $T_{OP}$. For instance, an input stage may be heated to a higher temperature than a subsequent stage of the same amplifier. According to an embodiment, the input stage can be the amplifier stage 25a of FIG. 1 and the later stage can be the amplifier stage 25f of FIG. 1. Heating an input stage to a higher temperature than a later stage can reduce overall power consumption in some instances. Moreover, an input stage typically dissipates less power than a subsequent stage. Thus, heating the input stage to a higher temperature only may dissipate less power than heating the subsequent stage to the same temperature. At the same time, in certain implementations, the later amplifier stage may be able to realize benefits of temperature stabilization at a lower temperature than the input stage. Alternatively or additionally, the later amplifier stage may experience more self-heating than the earlier amplifier stage and can thus reach substantially the same operating temperature with less heating from a heater. Accordingly, heating later amplifier stages to a lower temperature than an earlier stage may be able to reduce power consumption without substantially impacting performance. In certain embodiments, a multi-stage amplifier can include at least a first stage surrounded by thermally insulating sidewalls and a second stage outside of the thermally insulating sidewalls. According to some of these embodiments, the second stage can be included in a different thermally insulated region.

Figure 4A:
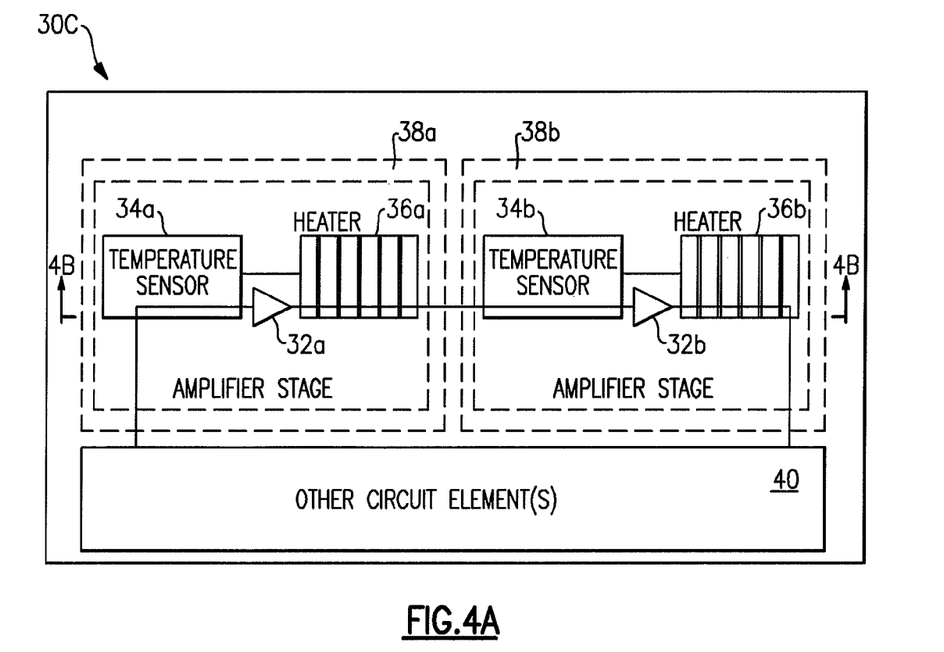
FIG. 4A is a block diagram of an integrated circuit that includes plurality of amplifier stages in semiconductor-on-insulator (SOI) technology and embedded heaters in separate regions thermally and electrically insulated by trenches, according to an embodiment.
Figure 4B:
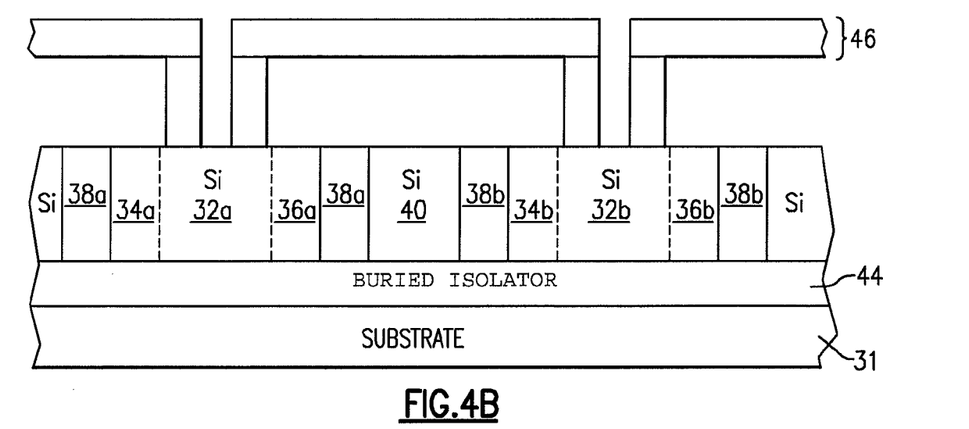
FIG. 4B a schematic cross section of the integrated circuit of FIG. 4A along the line 4B-4B.

Referring to FIGS. 4A and 4B, an integrated circuit 30c with a plurality of amplifier stages 32a and 32b heated in different thermally insulated regions will be described. In the embodiment illustrated in FIGS. 4A and 4B, temperature stabilization circuitry associated with different amplifier stages is also included in the different thermally insulated regions. In one embodiment, the amplifier stage 32a of FIGS. 4A and 4B can correspond to the amplifier stage 32 of FIGS. 2A and 2B and the other circuit elements 40 of FIGS. 2A and 2B can include the amplifier stage 32b of FIGS. 4A and 4B. Additionally, the temperatures sensor 34a and the heater 36a of FIGS. 4A and 4B can correspond to the temperature sensor 34 and the heater 36, respectively, of FIGS. 2A and 2B in some implementations. In another embodiment, the amplifier stage 32b of FIGS. 4A and 4B can correspond to the amplifier stage 32 of FIGS. 2A and 2B, and the other circuit elements 40 of FIGS. 2A and 2B can correspond to the amplifier stage 32a of FIGS. 4A and 4B. Additionally, the temperatures sensor 34b and the heater 36b of FIGS. 4A and 4B can correspond to the temperature sensor 34 and the heater 36, respectively, of FIGS. 2A and 2B according to some implementations.

FIG. 4A is a block diagram of an integrated circuit 30c that includes plurality of SOI amplifier stages 32a and 32b, temperature sensors 34a and 34b, and embedded heaters 36a and 36b in corresponding thermally insulated regions, according to an embodiment. FIG. 4B is a cross section of the integrated circuit 30c of FIG. 4A along the line 4B-4B. It will be understood that any of the principles and advantages discussed with reference to the embodiments of FIGS. 2A and 2B can be applied to the embodiments of FIGS. 4A and 4B. While two amplifier stages are described with reference to FIGS. 4A and 4B for illustrates purposes, it will be understood that the principles and advantages discussed herein can be applied to any suitable number of amplifier stages. For example, any number of the amplifier stages 25a to 25f illustrated in FIG. 1 can be disposed in different thermally insulated regions. Accordingly, a Log Amp can include two or more different stages can be disposed in different thermally insulated regions. As another example, the temperature stabilization discussed herein can be applied to amplifiers with at least eight stages. It will be understood that the integrated circuit 30c of FIGS. 4A and 4B can include more or fewer elements than illustrated. In some embodiments, the integrated circuit 30c can include any combination of features of the integrated circuit 10 of FIG. 1.

The first amplifier stage 32a, the first temperature sensor 34a, and the first heater 36a are disposed in a first thermally insulated region. First thermally insulated sidewalls 38a surround the first amplifier stage 32a, the first temperature sensor 34a, and the first heater 36a. The first temperature sensor 34a can sense a temperature associated with the first amplifier stage 32a. The temperature associated with the first amplifier stage 32a can be a temperature in the SOI material that includes the first amplifier stage 32a. The first heater 36a heats the first amplifier stage 32a based on feedback from the first temperature sensor 34a. The first amplifier stage 32a has an operating temperature $T_{OPa}$. Similarly, the second amplifier stage 32b, the second temperature sensor 34b, and the second heater 36b are disposed in a second thermally insulated region. Second thermally insulated sidewalls 38b surround the second amplifier stage 32b, the second temperature sensor 34b, and the second heater 36b. The second temperature sensor 34b can sense a temperature associated with the second amplifier stage 32b. The temperature associated with the second amplifier stage 32b can be a temperature in the SOI material that includes the second amplifier stage 32b. The second heater 36b heats the second amplifier stage 32b based on feedback from the second temperature sensor 34b. The second amplifier stage 32b has an operating temperature $T_{OPb}$.

By including a first amplifier stage 32a and a second amplifier stage 32b in different thermally insulated regions, the first amplifier stage 32a and the second amplifier stage 32b can be heated to different temperatures $T_{OPa}$ and $T_{OPb}$. Accordingly, the first amplifier stage 32a can be heated to a first temperature while the second amplifier stage 32b is heated to a second temperature. The first temperature $T_{OPa}$ and the second temperature $T_{OPb}$ can be at least 5° C. different from each other according to certain embodiments. In some of these embodiments, the first temperature and the second temperature can be at least 5° C. different from each other. The first temperature and the second temperature can be different from each other by an amount selected from a range from about 5° C. to 50° C. According to certain implementations, the first temperature and the second temperature can be different from each other by an amount selected from a range from about 5° C. to 25° C. According to some of these implementations, the first temperature and the second temperature can be different from each other by an amount selected from a range from about 5° C. to 15° C. In one non-limiting example, an input stage of a multi-stage amplifier can be heated to an operating temperature of approximately 60° C. and an output stage of the same multi-stage amplifier can be heated to an operating temperature of approximately 50° C. Accordingly, different amplifier stages of the same amplifier can be heated to temperatures that are approximately 10° C. different from each other. The multi-stage amplifier in this example can be a Log Amp. The temperatures of the different amplifier stages can be considered average temperatures if the temperature over a stage of an amplifier varies.

As shown in FIG. 4B, the first amplifier stage 32a can be in a first SOI material and the second amplifier stage 32b can be in a second SOI material. The second SOI material can be separated from the first SOI material by the thermally insulating sidewalls 38a, 38b. FIG. 4B illustrates that there can be other SOI material between the first thermally insulating sidewalls 38a and the second thermally insulating sidewalls 38b The other circuit elements 40 can be included in the other piece of SOI. The other circuit elements 40 can be included on the same substrate 31 as the first amplifier stage 32a and the second amplifier stage 32b. In an embodiment (not illustrated), the first thermally insulating sidewalls 38a and the second thermally insulating sidewalls 38b can share at least one sidewall. For instance, a single sidewall can separate the SOI material disposed above an insulator and that includes the first amplifier stage 32a, the first temperature sensor 34a, and the first heater 36a from the SOI material disposed above the insulator and that includes the second amplifier stage 32b, the second temperature sensor 34b, and the second heater 36b. As illustrated, conductive lines 46 can electrically connect the first amplifier stage 32a to the second amplifier stage 32b. The conductive lines 46 can also electrically connect the first amplifier stage 32a and/or the second amplifier stage 32b to circuitry outside the thermally insulated regions that include these amplifier stages. Moreover, thermally insulating sidewalls 38a, 38b can additionally be surrounded by other thermally insulating sidewalls for better thermal isolations in certain embodiments.

At least a portion of an amplifier can be heated in accordance with the principles and advantages discussed herein. A temperature associated with at least the portion of the amplifier can be sensed with a temperature sensor. The portion of the amplifier can be in a semiconductor material over an insulating layer (e.g., in an SOI substrate) and surrounded by insulating sidewalls, for example, as illustrated in any one of FIG. 2A through FIG. 4B. The portion of the amplifier can be heated with a heater in the semiconductor material responsive to sensing the temperature associated with the portion of the amplifier. This can maintain the portion of the amplifier at a selected temperature. The amplifier can be, for example, a logarithmic amplifier. The entire amplifier can be in the same piece of semiconductor material. In some other embodiments, for example as shown in FIGS. 4A and 4B, different amplifier stages can be in semiconductor materials that are separated by the insulating sidewalls. The heating can also include sensing a second temperature associated with two different stages of the amplifier and heating the different amplifier stages to maintain the different amplifier stages at different temperatures.

In some applications, several amplifier stages and/or circuitries can be heated to slightly different temperatures. The amplifier stage and/or circuitry that is heated to the highest temperature can be disposed in the center of the several amplifier stages and/or circuitries. This can reduce heating power for SOI material in the middle of a thermally insulated region. As one non-limiting example, a Log Amp can have 9 amplifier stages. The 9 amplifier stages can be arranged in a 3×3 grid with the amplifier stage in the middle of the grid having the lowest heating loss and the highest temperature. Such an arrangement can be advantageous when heaters are dissipating similar or approximately the same power levels.

The principles and advantages discussed herein can be implemented in a variety of technologies including, for example, CMOS, bipolar, BiCMOS, etc. In technologies without a buried insulator, deep tranches can provide electrical and thermal isolation.

Figure 5:
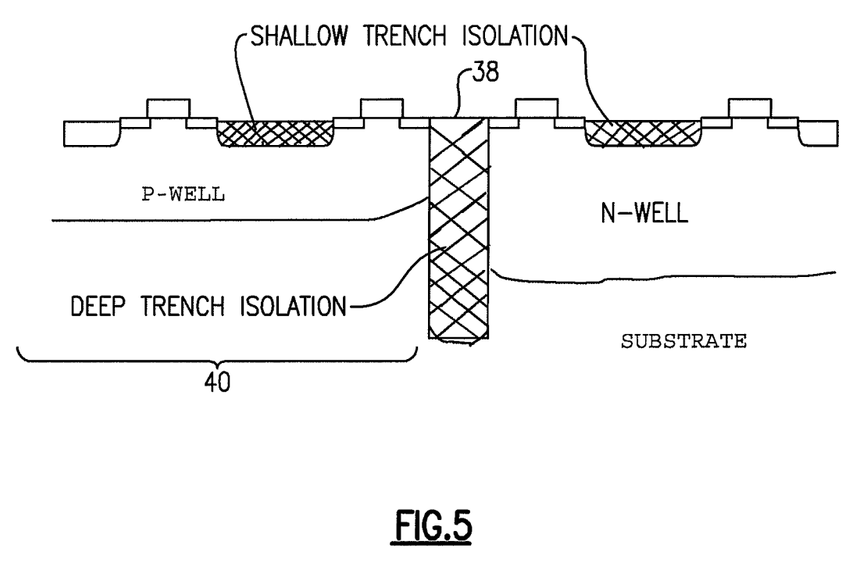
FIG. 5 is a schematic cross section of an integrated circuit with deep trench isolation separating the integrated circuit into different thermally insulated regions, according to an embodiment.

FIG. 5 is a schematic cross section of an integrated circuit in a non-SOI technology with deep trench isolation separating the integrated circuit into different thermally insulated regions, according to an embodiment. In FIG. 5, thermally insulating sidewalls 38 can be deep trenches separating a thermally insulated region from other circuit elements 40 outside of the thermally insulated region. The deep trenches of FIG. 5 can be implemented in connection with any suitable combination of features discussed with reference to FIGS. 1 to 4 in a non-SOI technology. Deep trenches can provide both thermal and electrical isolation. In contrast, the illustrated shallow trenches provide electrical isolation but do not provide thermal isolation. Field oxide isolation may also provide electrical isolation without providing thermal isolation.

A trench that is sufficiently deep and/or sufficiently thick can provide thermal isolation. For instance, a trench that extends beyond a well, such as an n-well, as shown in FIG. 5 can provide thermal isolation. In contrast, the shallow trench isolation, providing only electrical insulation between devices, is significantly less deep than the defined dopant wells, such as the illustrated N-well. In certain embodiments, the thermally insulating sidewalls can comprise a deep trench that is filled with an oxide, such as silicon dioxide, or other suitable insulating material. According to some embodiments, the thermally insulating sidewalls can comprise a deep trench that is filled with an oxide or other suitable insulating material and also filled with one or more other materials, such as polysilicon. In certain embodiments, the thermally insulating sidewalls can comprise two and more deep trenches.

The systems, apparatus, and methods of temperature stabilization are described above with reference to certain embodiments. A skilled artisan will, however, appreciate that the principles and advantages of the embodiments can be used for any other systems, apparatus, or methods with a need for temperature stabilization and/or a need for heating one or more circuit elements.

Such systems, apparatus, and/or methods can be implemented in various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, precision instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. For instance, it will be understood that the principles and advantages discussed herein can be used in any suitable integrated circuit with a need for temperature stabilization. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. An integrated circuit, comprising:
   temperature stabilized circuitry;
   a temperature sensor configured to gather an indication of temperature associated with the temperature stabilized circuitry;
   a heater configured to heat the temperature stabilized circuitry based on the indication of temperature; and
   other circuit elements that are different from the temperature stabilized circuitry, the temperature sensor, and the heater;
   wherein the other circuit elements, the temperature stabilized circuitry, the temperature sensor, and the heater are included on the same integrated circuit;
   wherein the other circuit elements comprise at least one of:
   control circuitry;
   power management circuitry; or
   a current mirror; and
   wherein the temperature sensor, the heater, and the temperature stabilized circuitry are thermally isolated from the other circuit elements.

2. The integrated circuit of claim 1,
   wherein the other circuit elements comprise the current mirror.

3. The integrated circuit of claim 1, wherein the temperature stabilized circuitry comprises a band gap reference circuit.

4. The integrated circuit of claim 3, wherein the temperature stabilized circuitry comprises a portion of an amplifier.

5. The integrated circuit of claim 1, further comprising thermally insulating sidewalls and a layer of insulator;
   wherein the thermally insulating sidewalls are configured to thermally isolate the temperature sensor, the heater, and the temperature stabilized circuitry from the other circuit elements; and
   wherein the thermally insulating sidewalls extend to the layer of insulator.

6. An apparatus comprising:
   at least a portion of an amplifier in a semiconductor material;
   a temperature sensor configured to gather an indication of temperature in the semiconductor material;
   a heater in the semiconductor material and configured to heat the portion of the amplifier based on the indication of temperature; and
   at least one thermally insulating sidewall configured to thermally isolate the portion of the amplifier, the temperature sensor, and the heater on one side of the thermally insulating sidewall from other circuit elements on an opposing side of the thermally insulating sidewall, wherein the portion of the amplifier and the circuit elements are included on the same integrated circuit.

7. The apparatus of claim 6, wherein the amplifier is a logarithmic amplifier.

8. The apparatus of claim 6, wherein the entire amplifier is surrounded by the thermally insulating sidewalls.

9. The apparatus of claim 8, further comprising a band gap reference circuit within the thermally insulating sidewalls.

10. The apparatus of claim 6, wherein thermally insulating sidewalls surround the portion of the amplifier, the thermally insulating sidewalls including the one thermally insulating sidewall.

11. The apparatus of claim 6, further comprising an insulating layer disposed below the semiconductor material.

12. The apparatus of claim 11, wherein the thermally insulating sidewalls extend from a surface of the semiconductor material to the insulating layer.

13. The apparatus of claim 6, wherein the amplifier comprises at least a first stage and a second stage, wherein the portion of the amplifier comprises the first stage, and wherein the second stage is on the opposing side of the thermally insulating sidewall.

14. The apparatus of claim 13, wherein the second stage is in a second semiconductor material separated from the semiconductor material by the thermally insulating sidewall.

15. The apparatus of claim 14, wherein the second stage is surrounded by second thermally insulating sidewalls.

16. The apparatus of claim 13, further comprising:
a second temperature sensor configured to generate a second indication of temperature associated with the second stage of the amplifier; and
a second heater configured to heat the second stage of the amplifier based on the second indication of temperature.

17. The apparatus of claim 16, wherein the first heater is configured to heat the first stage to a first average selected operating temperature while the second heater heats the second stage to a second average selected operating temperature, and wherein first average selected operating temperature and the second selected average operating temperature differ by at least 5° C.

18. The apparatus of claim 6, wherein the thermally insulating sidewall is filled with insulating material.

19. The apparatus of claim 6, wherein the heater comprises at least one of a transistor and a diode configured to generate heat.

20. A method of heating at least a portion of an amplifier, the method comprising:
sensing a temperature associated with at least a portion of an amplifier, wherein the portion of the amplifier is in a semiconductor-on-insulator (SOI) material over an insulating layer and surrounded by insulating sidewalls; and
heating the portion of the amplifier with a heater responsive to said sensing to maintain the portion of the amplifier at a selected operating temperature, wherein the heater is in the SOI material, and wherein the selected operating temperature is higher than an ambient temperature.

21. The method of claim 20, wherein the amplifier is a logarithmic amplifier.

22. The method of claim 20, wherein the entire amplifier is in the SOI material.

23. The method of claim 20, further comprising:
sensing a second temperature associated with a different portion of the amplifier, wherein the different portion of the amplifier is included in a different stage of the amplifier than the portion of the amplifier; and
heating the different portion of the amplifier with a different heater responsive to said sensing the second temperature to maintain the different portion of the amplifier at a second selected temperature, wherein the selected temperature is different from the second selected temperature.

24. The method of claim 20, wherein the heating maintains the portion of the amplifier at the selected operating temperature as the ambient temperature changes.

* * * * *